United States Patent

Murayama et al.

Patent Number: 6,141,425
Date of Patent: Oct. 31, 2000

[54] SOUND QUALITY ADJUSTMENT CIRCUIT

[75] Inventors: Kazuo Murayama; Toshiya Murakami, both of Kanagawa, Japan

[73] Assignee: Sony Corporation, Tokyo, Japan

[21] Appl. No.: 08/934,572

[22] Filed: Sep. 19, 1997

[30] Foreign Application Priority Data

Sep. 30, 1996 [JP] Japan .................................. 8-259352
Nov. 27, 1996 [JP] Japan .................................. 8-316723

[51] Int. Cl.[7] .............................. H03G 5/00; H03G 5/02; H03K 5/00
[52] U.S. Cl. .......................... 381/98; 381/103; 327/553; 334/29
[58] Field of Search ............................ 330/102; 327/553, 327/552; 332/117; 381/98, 103; 333/28 R, 28 T

[56] References Cited

U.S. PATENT DOCUMENTS

| | | | |
|---|---|---|---|
| 4,393,353 | 7/1983 | Minagawa | 330/102 |
| 4,994,766 | 2/1991 | Miura | 332/117 |
| 5,182,478 | 1/1993 | Nomura | 307/521 |
| 5,745,001 | 4/1998 | Ueshima et al. | 327/553 |

OTHER PUBLICATIONS

Don Lancaster, Active Filter cookbook, Howard W. Sams & Co., Inc. ISBN 0–672–21168–8, pp. 171–176, Jan. 1975.

*Primary Examiner*—Forester W. Isen
*Assistant Examiner*—Brian Tyrone Pendleton
*Attorney, Agent, or Firm*—Jay H. Maioli

[57] ABSTRACT

A sound quality adjustment circuit including a status variable type active band-pass filter having an amplification circuit fed with an input signal and an integration circuit, and a controller for controlling the conversion conductance of the amplification circuit. The center frequency of the status variable type active band-pass filter is continuously varied by controlling the conversion conductance of the amplification circuit by the controller.

1 Claim, 9 Drawing Sheets

SOUND QUALITY ADJUSTMENT CIRCUIT

BACKGROUND OF THE INVENTION

1. Field of the Invention

This invention relates to a sound quality adjustment circuit. More particularly, it relates to a sound quality adjustment for adjusting frequency characteristics of an audio signal range.

2. Description of the Related Art

For adjusting the sound quality of the audio signal depending on the conditions of the sound source or the playback sound field or on the hearing power or the preference of the listener, a tone control circuit for continuously changing the gain of a specified frequency range or a graphic equalizer circuit for splitting the frequency spectrum into plural bands and for changing the gain in each of the split bands is used extensively.

FIG. 1 shows the manner of sound quality adjustment by the tone control circuit. In an instance shown in FIG. 1, the center frequency of the band in which to adjust the sound quality of the audio signal is fixed at 1 kHz. The gain can be changed continuously in a lower side within a band of the turnover frequency of $f_{L1}$ to $f_{L2}$ and in a higher side within a band of the turnover frequency $f_{H1}$ to $f_{H2}$. In this manner, the tone control circuit adjusts the sound quality in accordance with pre-set frequency characteristics, while it cannot augment or attenuate the gain within each split band.

Conversely, the graphic equalizer circuit splits the audio signal into plural frequency bands to augment or attenuate the gain in each of the split frequency bands. FIG. 2 schematically shows the manner of sound quality adjustment by this graphic equalizer circuit. In the present instance, the frequency spectrum is split into five bands.

However, the center frequencies f1, f2, f3, f4 and f5 of the frequency bands of the graphic equalizer circuit are usually fixed at pre-set values, and cannot be changed freely. Thus, there are occasions wherein the signals of desired frequencies cannot be augmented or attenuated.

In FIGS. 1 and 2, the response on the ordinate represents the intensity ratio (gain) of an output signal to an input signal. The response portion above 0 dB and that below 0 dB indicate that the signal is augmented and attenuated, respectively.

FIG. 3 shows an illustrative structure of such a graphic equalizer circuit.

The graphic equalizer circuit includes an input terminal 111, to which an input signal Vi is applied, an operational amplifier 112, having an non-inverting terminal and an inverting terminal and an output terminal 113 for outputting an output signal Vo. To the inverting input terminal of the operational amplifier 112 is entered the output signal Vo via a negative feedback resistor Ro.

The band-pass filter 31A has a center frequency $\omega_0$ and a transfer function H(s). A pair of voltage-current converters 32A, 33A voltage-current convert an output signal of the band-pass filter 31A. The voltage-current converters 32A, 33A are constituted by current mirror circuits as later explained. The values of conversion conductance of the first and second voltage-current converters 32A, 33A are (1−a) gm and (1+a)gm, respectively, where −1<a<1.

If the graphic equalizer circuit is constructed for splitting the frequency into N portions, N sets each made up of the band-pass filter 31A, first voltage-current converter 32A and the second voltage-current converter 33A are arranged in parallel as indicated by dotted lines in FIG. 3. The signals of the first to Nth bands, having the gain changed by N band-pass filters 31A, 31B, 31C, ..., 31N, taking charge of the split N bands, are summed by the operational amplifier 2 and outputted as an output signal V0 at an output terminal 3.

The frequency characteristics shown in FIG. 2 correspond to those of the output signal Vo obtained by splitting an input signal into five frequency bands, changing the gain values of the five band signals by band-pass filters 31A, 31B, 31C, ... 31H taking charge of the spit five bands, summing the respective spilt signals by the operational amplifier 2 and outputting the sum signal at an output terminal 3.

By employing the graphic equalizer circuit, it becomes possible to split the audio signal into plural frequency bands and to augment or attenuate the gain optionally in each of the split frequency bands. However, since the center frequencies of the split bands are fixed, there are occasions wherein signals of the desired frequency cannot be augmented or attenuated with a smaller number of divisions of the frequency spectrum.

Of course, if the number of divisions of the frequency spectrum is increased and the gain is changed in each of the split frequency bands, it becomes possible to change the gain only of the signal of the desired frequency optionally. However, this method is not desirable for application to a practical circuit required to be small in size and inexpensive because of the increased circuit scale and raised cost.

SUMMARY OF THE INVENTION

It is therefore an object of the present invention to provide a sound quality adjustment circuit which resolves the above-mentioned problems.

According to the present invention, there is provided a sound quality adjustment circuit including a status variable type band-pass filter and a controller. The status variable type active band-pass filter is fed with an input signal. The controller controls the conversion conductance of the status variable type band-pass filter. The center frequency of the status variable type active band-pass filter is continuously varied by controlling the conversion conductance by the controller.

According to the present invention, there is also provided a sound quality adjustment circuit including a first operational amplifier and a series resonance circuit. The first operational amplifier has a non-inverting input terminal fed with an input signal, and an inverting input terminal connected to an output terminal via a negative feedback resistor. The series resonance circuit includes a first capacitor and a simulation inductance circuit. The first capacitor is connected across the inverting input terminal of the first operational amplifier and the ground. The simulation inductance circuit has a second operational amplifier. A first variable resistor is connected across an output terminal of the second operational amplifier and a connection terminal to the first capacitor. A second capacitor is connected across the non-inverting input terminal of the second operational amplifier and the connection terminal of the first capacitor. The output terminal of the second operational amplifier is directly coupled to its inverting input terminal. A second variable resistor is connected across the non-inverting input terminal of the second operational amplifier and the ground. The first and second variable resistors are operatively interlinked to each other.

DESCRIPTION OF THE PREFERRED EMBODIMENTS

Figure 1:
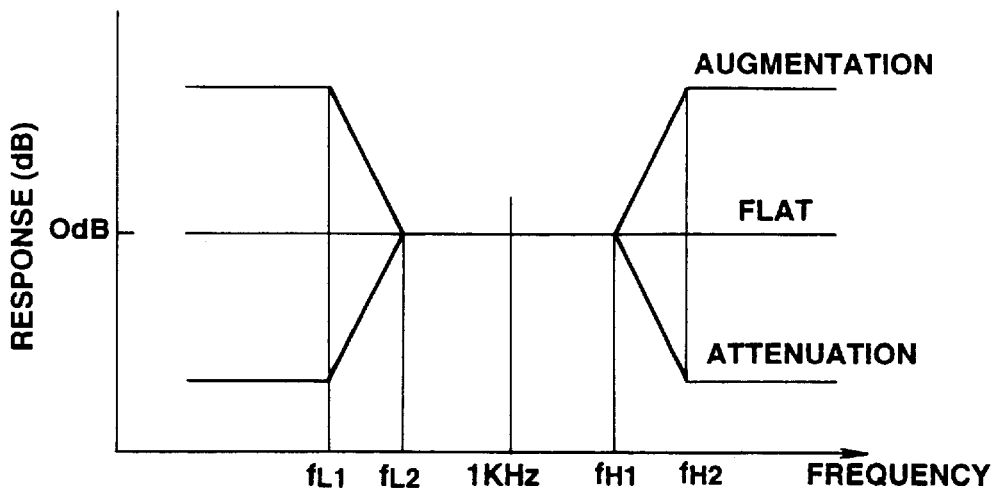
FIG. 1 illustrates the sound quality adjustment operation by a tone control circuit.
Figure 2:
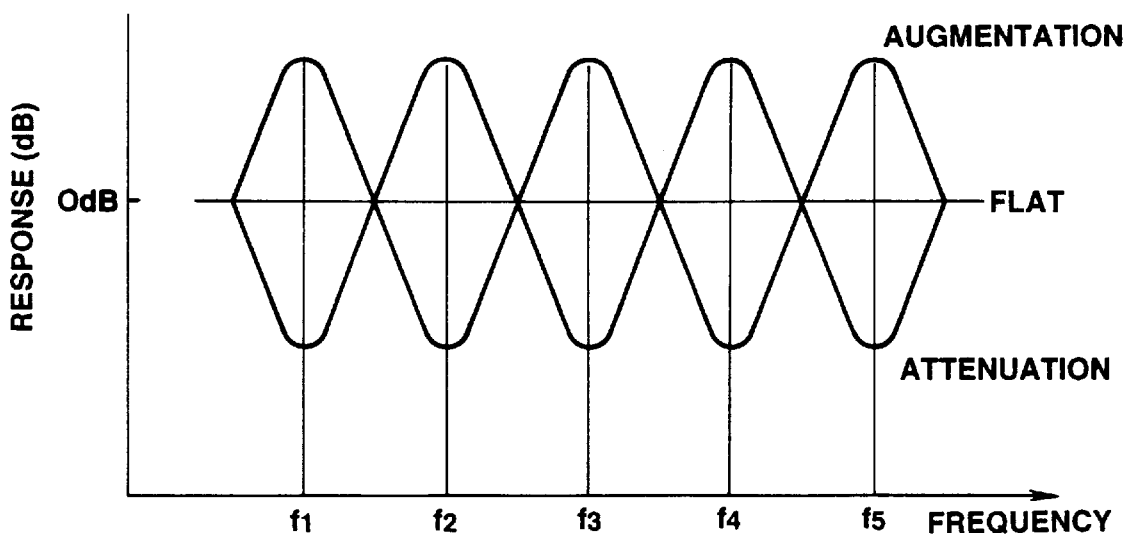
FIG. 2 illustrates the sound quality adjustment operation by a graphic equalizer circuit.
Figure 3:
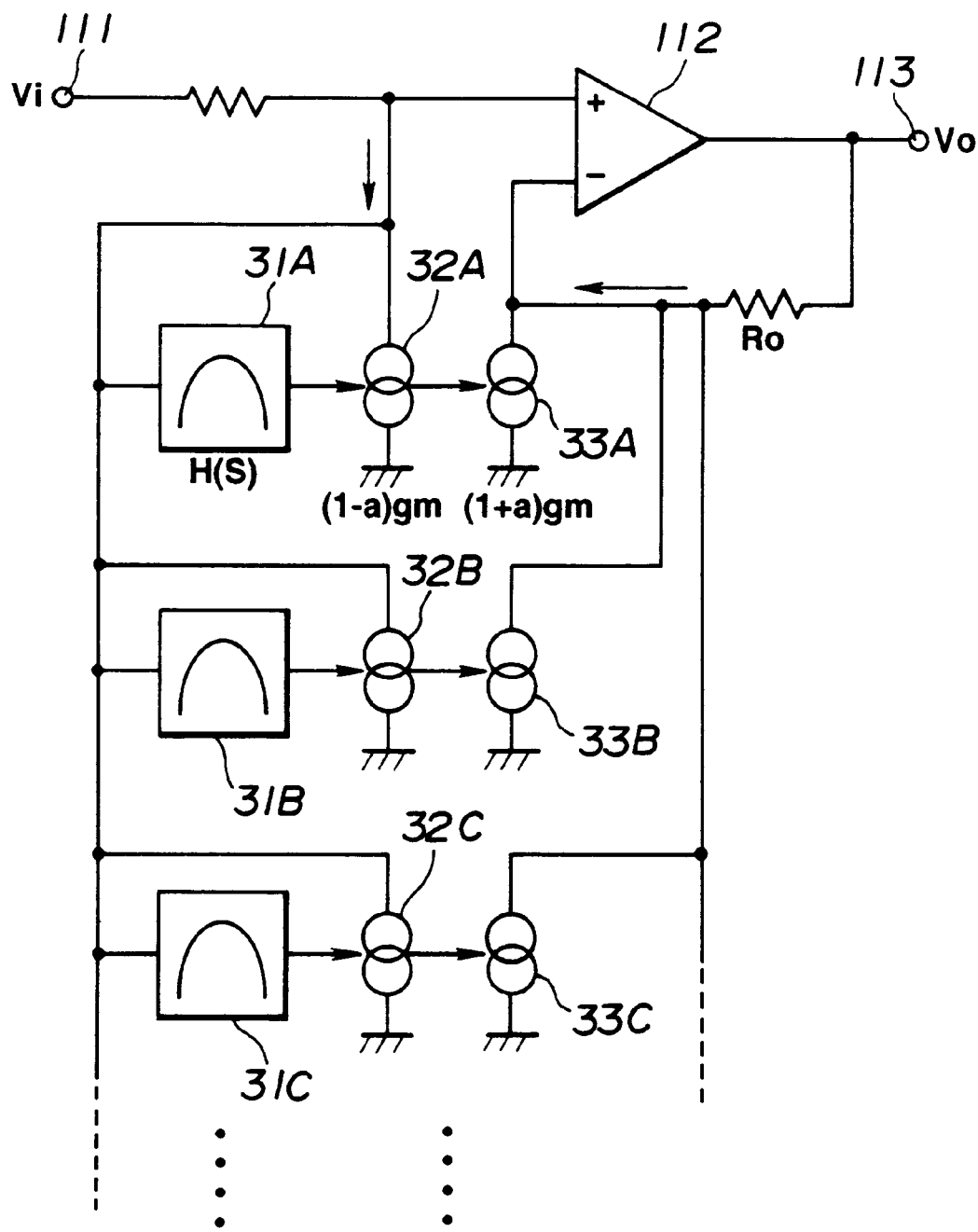
FIG. 3 is a circuit diagram for illustrating the sound quality adjustment operation by the graphic equalizer circuit.

Referring to the drawings, the sound quality adjustment circuit of the present invention will be explained in detail.

Figure 4:
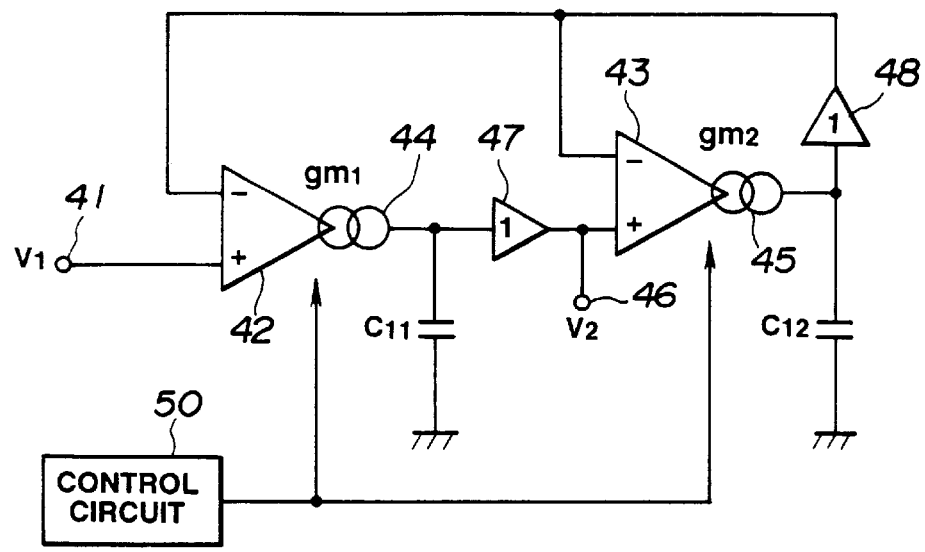
FIG. 4 is a circuit diagram showing a basic structure of a status variable type band-pass filter.

Referring first to FIG. 4, a sound quality adjustment circuit according to a first embodiment of the present invention is explained.

Figure 5:
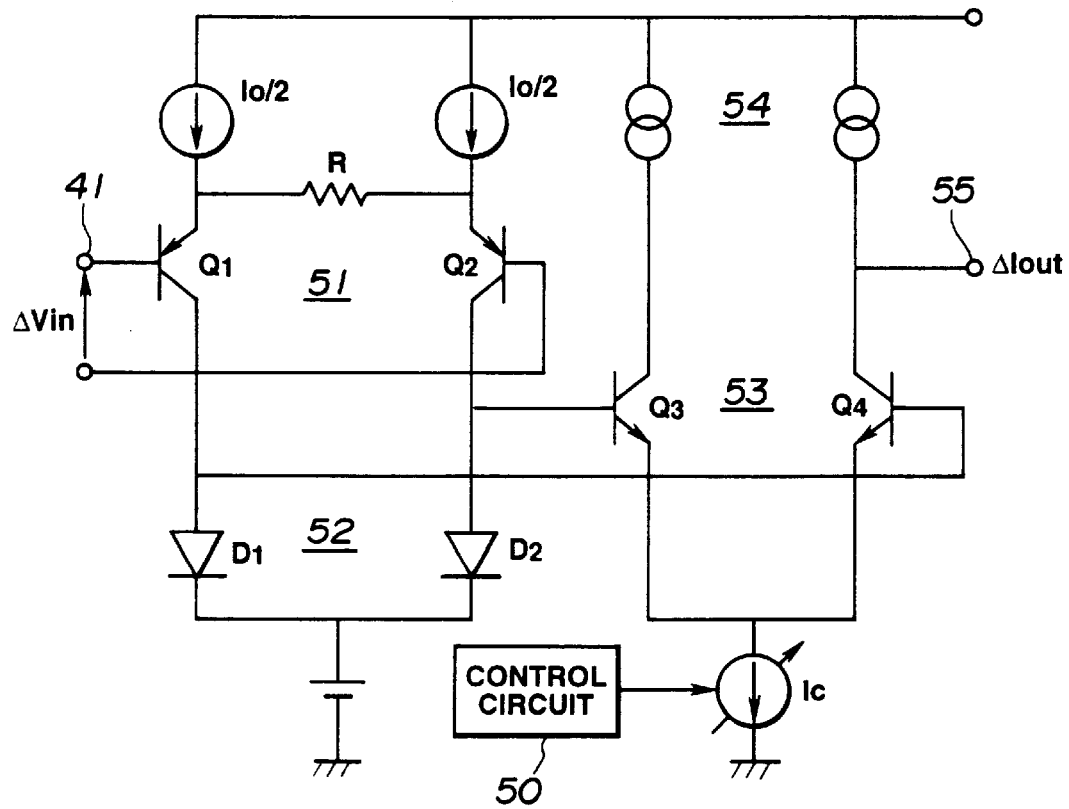
FIG. 5 is circuit diagram showing a stage of a transconductance amplifier in the band-pass filter shown in FIG. 4.

Before proceeding to the description of the first embodiment of the sound quality adjustment circuit, the band-pass filter is explained by referring to FIGS. 4 and 5.

The band-pass filter circuit shown in FIG. 4 is an active filter termed a status variable (bi-quad) type filter and is made up of an adder and an integrator. In FIG. 4, the reference numeral 41 denotes an input terminal, while the reference numerals 42, 43 denote adders. A voltage-to-current converter 44 and a capacitance $C_{11}$, and a voltage-to-current converter 45 and a capacitance $C_{12}$ respectively correspond to integrators. The reference numerals 47, 48 denote buffers.

The circuit portions made up of the operational amplifier 42 and the voltage-to-current converter 44 and those made up of the operational amplifier 43 and the voltage-to-current converter 45 respectively constitute so-called transconductance amplifiers. The conversion conductance values $g_{m1}$ and $g_{m2}$ of these two transconductance amplifiers can be changed by control signals from a control circuit 50.

If the input signal voltage applied across the input terminal 41 is $V_1$, an output signal voltage outputted at an output terminal 46 is $V_2$ and the transfer functions of the above two circuits corresponding to the integrators are $Q \cdot \omega_0/S$ and $\omega_0/(S \cdot Q)$, the transfer function H(s) of the present band-pass filter circuit in its entirety is represented by the following equation:

$$H(s) = \frac{V_2}{V_1} = \frac{S \cdot Q / \omega_0}{1 + S/(Q/\omega_0) + S^2/\omega_0^2} \quad (1)$$

If the band-pass filter has the transfer function given by the above equation, and the voltage of the input terminal of the operational amplifier 2 is $V_1$, the following equations:

$$V_1 = Vi - Ri \cdot Ii \quad (2)$$

$$Ii = Vi(1-a)g_m \cdot H(s) \quad (3)$$

$$V_o = Vi + R_0 \cdot I_0 \quad (4)$$

hold, Putting the above equations in order, the following equations:

$$I_i = V_i \cdot \frac{S(1-a)g_m/(Q \cdot \omega_0)}{1 + S[1 + (1-a)R_i g_m]/(Q \cdot \omega_0) + S^2/\omega_0^2} \quad (5)$$

$$V_i = V_i \cdot \frac{1 + S/(Q \cdot \omega_0) + S^2/\omega_0^2}{1 + S[1 + (1-a)R_i g_m]/(Q \cdot \omega_0) + S^2/\omega_0^2} \quad (6)$$

$$I_0 = V_i \cdot V_i(1+a)g_m \cdot H(s) = I_i \cdot \frac{1+a}{1-a} \quad (7)$$

are obtained.

Taking into account the fact that, in order for the attenuation characteristics and accentuation characteristics of a signal to be symmetrical to each other, $Ri = R_0 = R$ must hold, $V_0$ is found to give the equation (8):

$$V_o = V_i \cdot \frac{1 + S[1 + (1+a)Rg_m]/(Q \cdot \omega_0) + S^2/\omega_0^2}{1 + S[1 + (1-a)Rg_m]/(Q \cdot \omega_0) + S^2/\omega_0^2} \quad (8)$$

If, from this equation (8), the transfer function T(S)=Vo/Vi is found, the following equation (9):

$$T(s) = \frac{1 + S[1 + (1+a)Rg_m]/(Q \cdot \omega_0) + S^2/\omega_0^2}{1 + S[1 + (1-a)Rg_m]/(Q \cdot \omega_0) + S^2/\omega_0^2} \quad (9)$$

is obtained.

If, in the above equation (9), a=1, the following equation (10):

$$T(s) = \frac{1 + S(1 + 2Rg_m)/(Q \cdot \omega_0) + S^2/\omega_0^2}{1 + S(Q \cdot \omega_0) + S^2/\omega_0^2} \quad (10)$$

is obtained.

Therefore, the amplitude characteristics are accentuated with the center resonance frequency $\omega_0 = 2\pi f0$, with the gain at this time being $(1+2Rg_m)$.

If, in the above equation (9), a=−1, the following equation (11):

$$T(s) = \frac{1 + S(Q \cdot \omega_0) + S^2/\omega_0^2}{1 + S(1 + 2Rg_m)/(Q \cdot \omega_0) + S^2/\omega_0^2} \quad (11)$$

is obtained. The amplitude characteristics represent attenuation characteristics in which the gain at the center frequency $\omega_0$ is equal to $1/(1+2Rg_m)$.

Thus, the graphic equalizer circuit is made up of band-pass filter and two voltage-to-current converters whose $g_m$ is changed differentially with the coefficient α.

It is now assumed that, in the band-pass filter, the conversion conductance $g_{m1}$ of the voltage-to-current converter 44 and the conversion conductance $g_{m2}$ of the voltage-to-current converter 45 are equal to each other.

If $g_{m1}=g_{m2}=g_{m3}$, the center frequency (resonant frequency) of the passband and Q of resonance are given by the following equations (12) and (13):

$$\omega_0 = g_m \cdot \{1/(C_{11} \cdot C_{12})\}^{1/2} \tag{12}$$

$$Q = (C_{12}/C_{11})^{1/2} \tag{13}$$

That is, if the values of conversion conductance of the two voltage-to-current converters making up the band-pass filter circuit are equal to each other, the center frequency of the band-pass filter $\omega_0$ can be changed without varying the value of Q of resonance.

FIG. 5 shows an example of a one-stage circuit of a transconductance amplifier made up of the operational amplifier and the voltage-to-current converters in the band-pass filter circuit of FIG. 4.

In this transconductance amplifier, an operational amplifier 51 made up of transistors $Q_1$ and $Q_2$ fed with an input voltage $\Delta V_{in}$, a diode pair 52 made up of diodes D1, D2 and a pair of current sources Io/2 correspond to the operational amplifier 42 of FIG. 4. The portion made up of a pair of current-to-voltage converters 54 and a differential amplifier 53 made up of transistors $Q_3$, $Q_4$ correspond to the voltage-to-current converter 43 of FIG. 4. An output terminal 55 outputting an output current $\Delta I_{out}$ corresponds to the terminal 49 of FIG. 4. A control circuit 50 represents means for controlling the current of the current source $I_c$ of this transconductance amplifier. The control circuit 50 will be discussed subsequently.

The operational amplifier 43 and the voltage-to-current converter 45, making up the downstream side portion of the band-pass filter circuit of FIG. 4, are configured similarly. In FIG. 4, an output is taken out between the first-stage transconductance amplifier and the second-stage transconductance amplifier. This configuration is equivalent to taking out an output of the second-stage transconductance amplifier.

If the total current flowing through the transistor pair $Q_1$ and $Q_2$ is $I_o$, an input voltage $\Delta V_{in}$ is given by the equation:

$$\Delta V_{in} = \Delta I_{out} \cdot (1/R) \cdot (Ic/Io) = \Delta I_{out} \cdot (1/g_m) \tag{14}$$

As may be seen from this equation, the value of conversion conductance $g_m$ of this transconductance amplifier is changed by changing the current of the current source $I_c$ connected to the voltage-to-current converter by a control current from the control circuit 50. The center frequency $\omega_0$ of the band-pass filter constituted by this transconductance amplifier is changed in proportion to changes in the conversion conductance $g_m$ as indicated by the equation (12).

Figure 6:
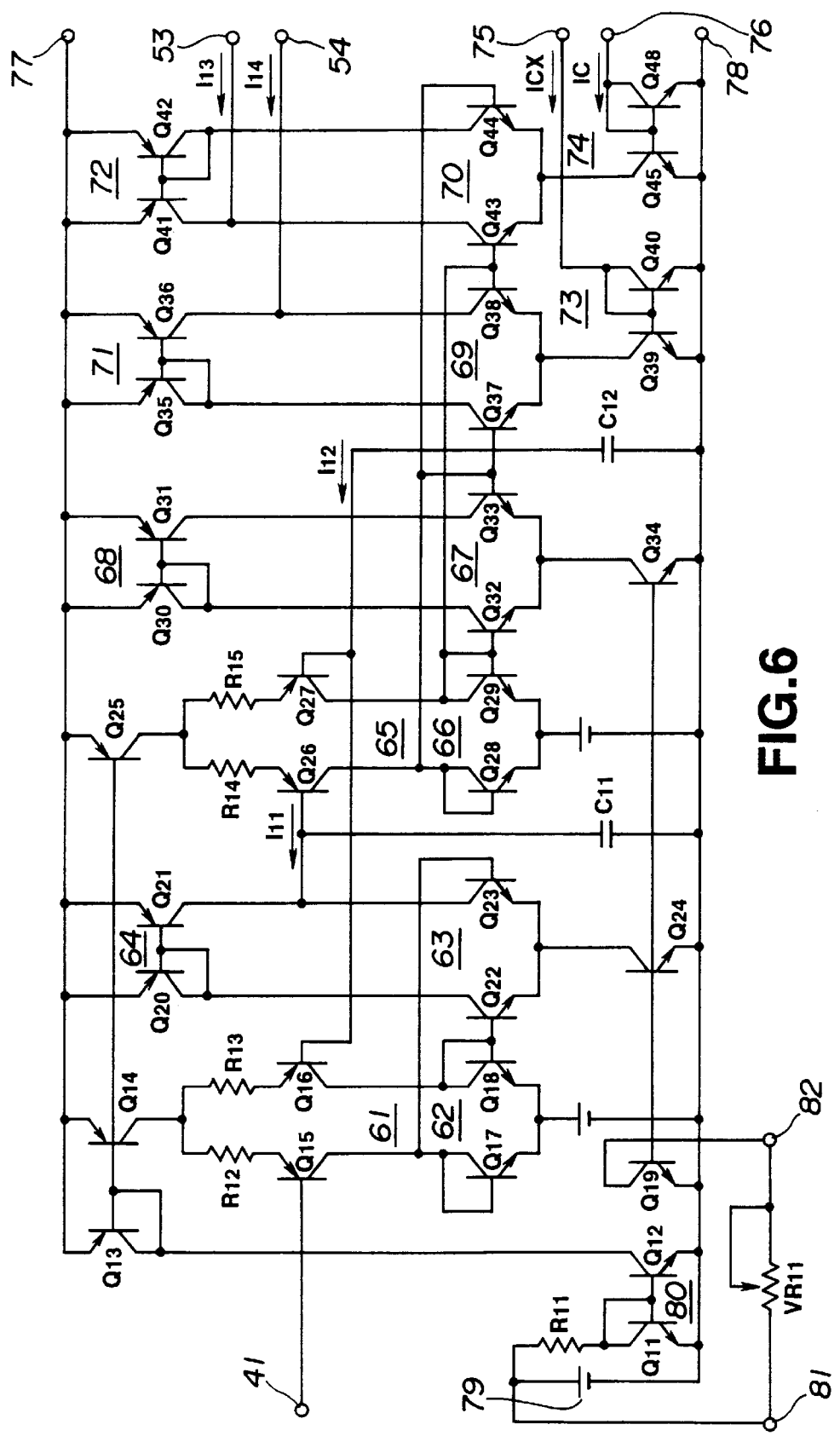
FIG. 6 is a circuit diagram showing an illustrative structure of the band-pass filter shown in FIG. 4.

FIG. 6 shows an illustrative structure of the band-pass filter explained with reference to FIGS. 4 and 5.

An input signal entering the input terminal 41 is converted by a differential amplifier 61 into current which then is fed to a diode pair 62 constituted by shorting the base and collector terminals of transistors $Q_{17}$ and $Q_{18}$. The voltage across both ends of the diode pair 66 is applied across the base terminals of a differential amplifier 67 so as to be taken out as an output current $I_{12}$ by a current mirror 68.

The current $I_{12}$, taken out by the current mirror 68, is integrated by a capacitance $C_{12}$ so as to be fed back to the differential amplifiers 61, 65. The voltage across both ends of the diode pair 66 is applied across the base terminals of the differential amplifiers 69 and 70. To the collector electrodes of the differential amplifiers 69 and 70 are connected to current mirrors 71, 72, respectively, for taking out output currents $I_{13}$ and $I_{14}$.

To a common emitter terminal of the differential amplifiers 69 and 70 are connected current mirrors 73, 74 to which control currents ICX, IC for varying the circuit gain are supplied, respectively, via terminals 75, 76, respectively. It is noted that terminals 77, 78 are positive and negative terminals, respectively.

A voltage source 79 is a bias voltage source for affording the bias current and furnishes the bias current to a current mirror 80 via $R_{11}$. This current furnishes the bias current via transistors $Q_{13}$, $Q_{14}$ and $Q_{25}$ to the differential amplifiers 61, 65.

The bias voltage source 79 furnishes the bias current which is taken out at a terminal 81 to flow via a variable resistor $VR_{11}$ and a terminal 82 into transistor $Q_{19}$ and through transistors $Q_{24}$ and $Q_{34}$ into differential amplifiers 63, 64. This varies the variable resistance $VR_{11}$ to vary the conversion conductance $g_m$.

This band-pass filter circuit faithfully implements the system shown in FIGS. 4 and 5, and represents a system that lends itself to constitution as an IC. If the circuit is designed as an IC, the capacitances $C_{11}$ and $C_{12}$ may be arranged in the IC or outside the IC. In general, the capacitances are mounted internally if the circuit is designed for a mid to high frequency range whereas, if the circuit is designed for a low frequency range, the capacitances are increased in value and hence are desirably mounted outside the IC. The sound quality adjustment circuit can be constructed using the above-mentioned status variable type band-pass filter other than the filter described above. This configuration is optimum for a circuit designed as IC with the capacitances mounted outside the circuit because the capacitances $C_{11}$, $C_{12}$ have one ends connected to ground.

Figure 7:
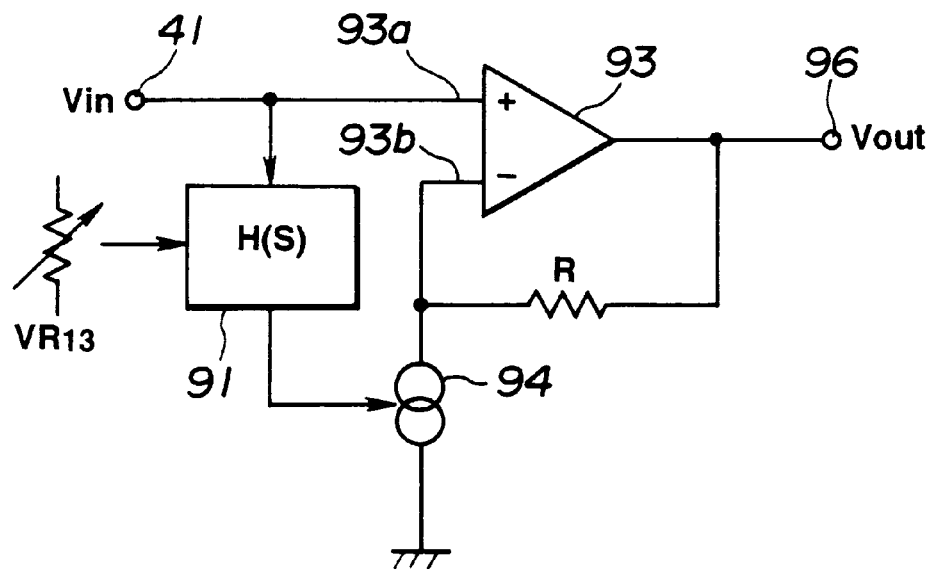
FIG. 7 is a circuit diagram showing a sound quality adjustment circuit according to a second embodiment of the present invention.

FIG. 7 shows a sound quality adjustment circuit constructed using a band-pass filter as the above-mentioned status variable type active filter according to a first embodiment of the present invention. In this figure, H(s) denotes the transfer function of the above-mentioned band-pass filter.

The first embodiment of the sound quality adjustment circuit is configured so that the input signal $V_{in}$ entering an input terminal 41 is amplified by an operational amplifier and outputted at an output terminal 96. The frequency response of the operational amplifier is controlled at this time based on the frequency response of the band-pass filter circuit.

The input signal $V_{in}$ entering the input terminal 41 is entered to a band-pass filter 91 and to a non-inverting input terminal 93a of an operational amplifier 95. The operational amplifier 93 also includes an inverting input terminal 93b connected via a feedback resistor R to an output terminal 96 and a voltage-to-current converter 94 connected across an inverting input terminal 93b and the ground.

The value of the conversion conductance $g_m$ of the voltage-to-current converter 94 is changed by changing the current of the current source connected to the voltage-to-current converter 94 by a variable resistor $VR_{13}$. In FIG. 6, this variable resistor $VR_{13}$ is equivalent to the variable resistor $VR_{11}$ as control means for controlling the bias current supplied from the voltage source 79.

In the present sound quality adjustment circuit, the gain is kept constant and the center frequency $\omega_0$ is changed. However, the center frequency $\omega_0$ can also be varied with the gain. This configuration will be explained subsequently.

Figure 8:
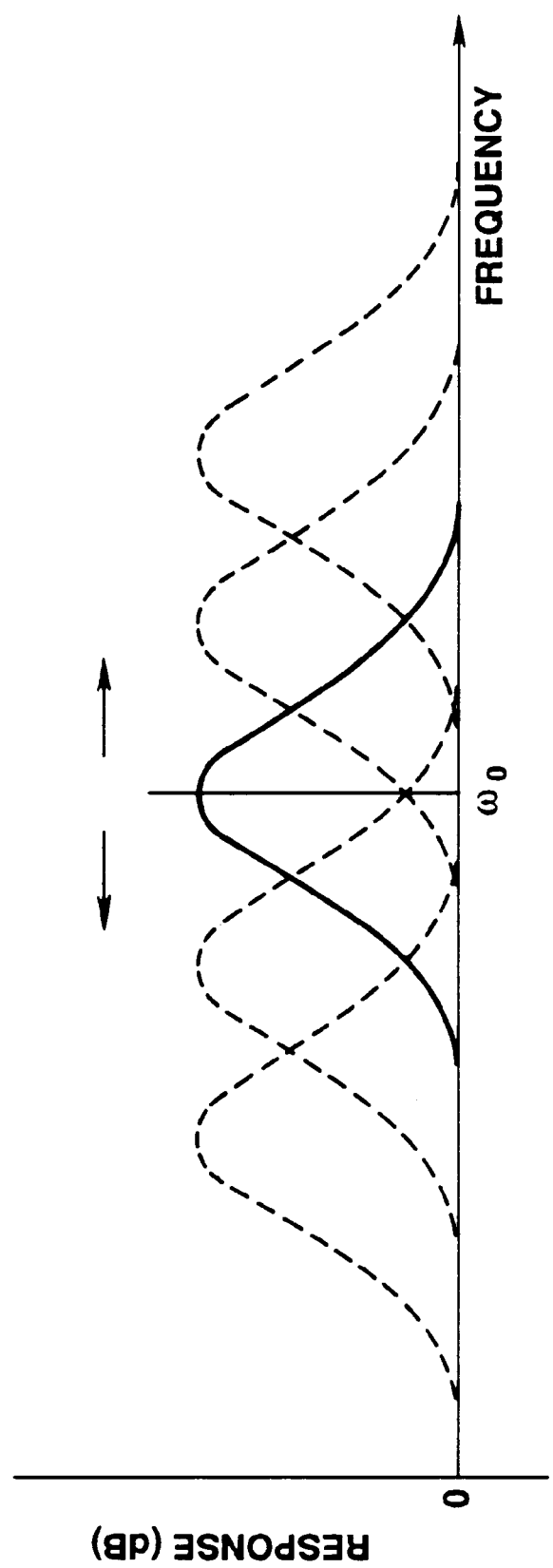
FIG. 8 illustrates the operation of the first embodiment of the sound quality adjustment circuit.

FIG. 8 shows the operation of the sound quality adjustment circuit of FIG. 7. With the present sound quality adjustment circuit, the center frequency $\omega_0$ can be varied freely by varying the value of the variable resistor VR. That is, the frequency response according a pre-set gain to the signal, as indicated by a solid line, can be moved on the frequency axis as indicated by an arrow in FIG. 8.

Thus it is seen that, in contradistinction from the graphic equalizer circuit shown in FIG. 1, there is no necessity of arranging plural state circuits in parallel for varying the gain of the frequency components of optional frequencies. Although the operation shown in FIG. 8 is that for augmenting the signal components of an optional frequency at a pre-set gain, an arrangement may also be made so that signal components can be augmented or attenuated with an optional gain.

Figure 9:
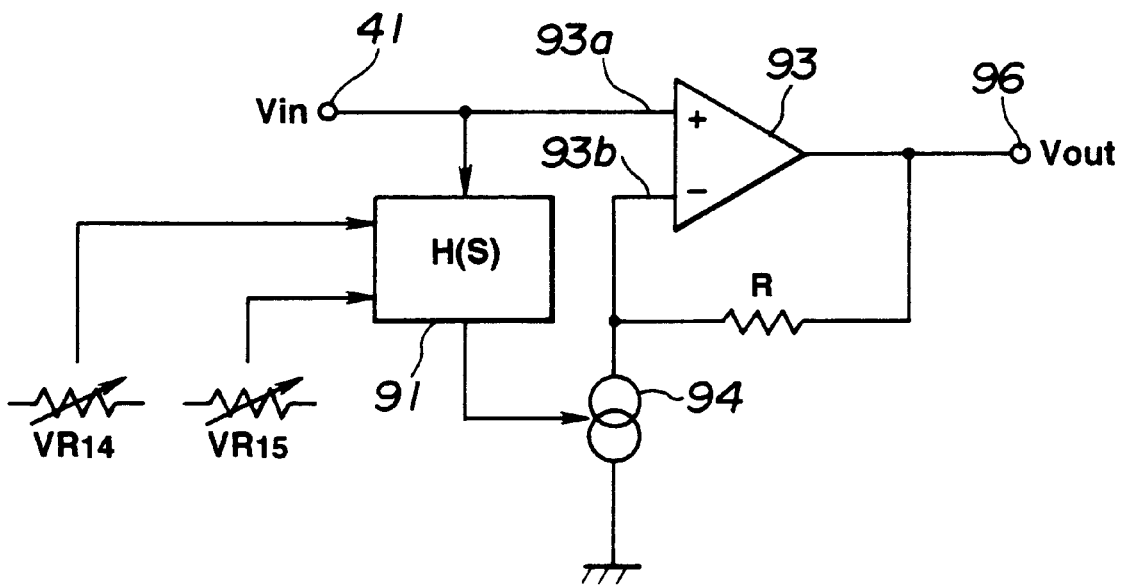
FIG. 9 is a circuit diagram showing a sound quality adjustment circuit according to a third embodiment of the present invention.

FIG. 9 shows the configuration of a second embodiment a sound quality adjustment circuit in which, in the sound quality adjustment circuit of FIG. 7, both the center frequency $\omega_0$ and the gain are variable. The second embodiment, shown in FIG. 9, is similar in configuration to the second embodiment of FIG. 9 in which only the gain is variable. Specifically, the present second embodiment differs in configuration from the embodiment of FIG. 7 by a variable resistor $VR_{14}$ for varying the center frequency $\omega_0$ by varying the conversion conductance $g_m$ of the voltage-to-current converter, and a variable resistor $VR_{13}$ for varying the gain. The variable resistor $VR_{14}$ for varying the center frequency $\omega_0$ corresponds to the variable resistor $VR_{13}$ in FIG. 7. This variable resistor $VR_{14}$ may be controlled independently of the variable resistor $VR_{15}$ designed for varying the gain, or controlled in a operative association with the variable resistor $VR_{13}$ designed for varying the gain so that a pre-set relation will be met.

The variable resistor $VR_{14}$ for varying the gain is equivalent to control means in FIG. 6 for varying the control current ICX entered at terminal 75 and the control current IC entered at terminal 76 and operates for augmenting or attenuating the signal if IC>ICX or ICX>IC, respectively.

Figure 10A:
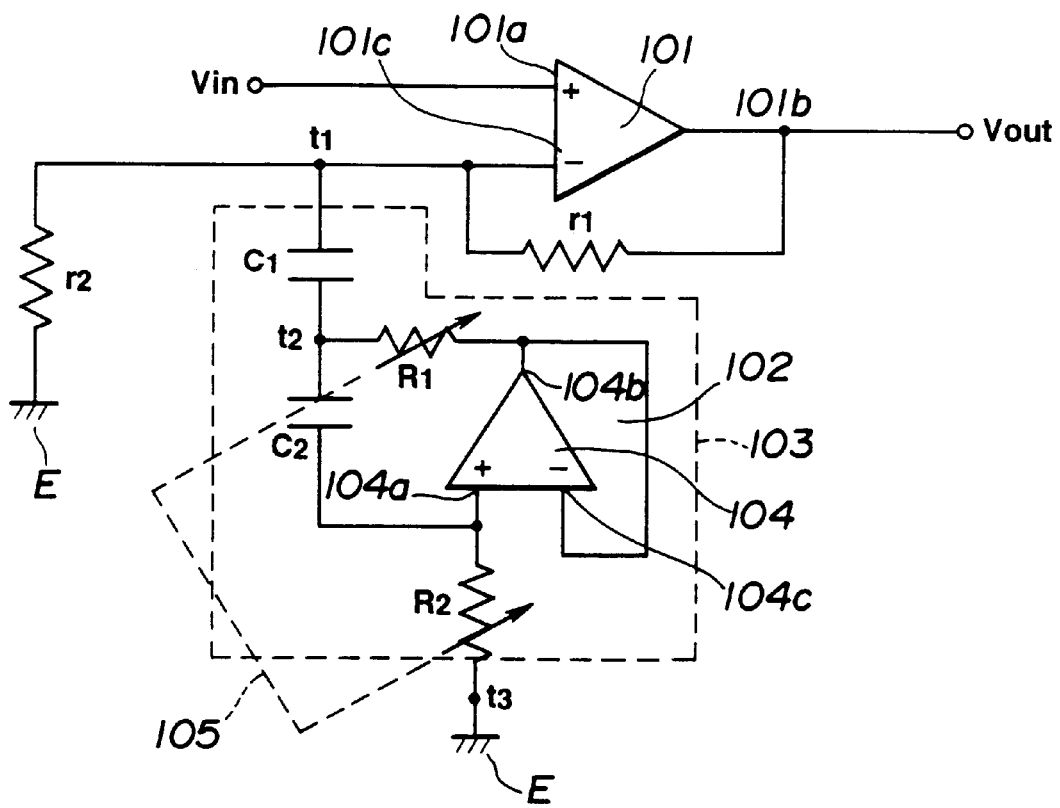
FIGS. 10(A), 10(B), and 10(C) are circuit diagrams showing the third embodiment of the sound quality adjustment circuit.
Figure 10B:
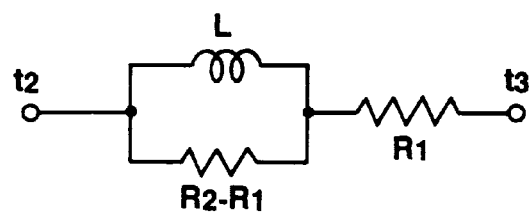

Referring to FIG. 10A, a third embodiment of the sound quality adjustment circuit is explained.

FIG. 10(A) shows a circuit diagram of the sound quality adjustment circuit according to a third embodiment of the present invention. The sound quality adjustment circuit includes an operational amplifier 101 having a non-inverting input terminal 101a, supplied with an input signal $V_{in}$, and an inverting input terminal 101c connected to an output terminal 101b via a feedback resistor r1.

A series resonance circuit 103, made up of a simulation inductance circuit 102 and a first capacitor $_{C11}$, is connected across a terminal t1 connected to the inverting input terminal 101c and the ground E. A resistor r2 is connected across the terminal t1 and the ground E. The simulation inductance circuit 102 includes a second operational amplifier 104, a first variable resistor R1 connected across the output terminal 104b and the terminal t2 and a second capacitance C2 connected across the non-inverting input terminal 104a and a terminal t2.

The first variable resistor $R_1$ and the second variable resistor $R_2$ are interconnected by interlock means 105 for adjustment in an interlocked relation to each other.

The operation and the conditioning of the present sound quality adjustment circuit are hereinafter explained.

The inductance Z(s) of the simulation inductance circuit 102, connected across the terminals $t_2$ and $t_3$, is represented by $A(s)=R_1 \cdot (1+S \cdot C_2 \cdot R_2)/1+S \cdot C_2 \cdot R_1$, with an equivalent circuit of the simulation inductance circuit 102 being a series/parallel circuit made up of a parallel connection of an inductance L and resistors $R_2-R_1$ connected in series with a resistor $R_1$.

Figure 10C:
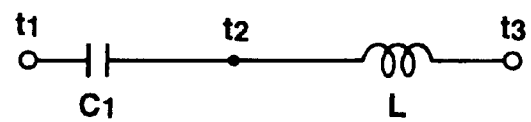

The equivalent circuit has the inductance L given by $L=C_2 \cdot R_1(R_2-R_1)$. By conditioning of $R_2 \gg R_1$, $L \approx C_2 \cdot R_1 \cdot R_2$, such that a series resonance circuit of the capacitance $C_1$ and the inductance L as shown in FIG. 10c is formed. The resonance frequency at this time is represented by the following equation:

$$\omega_0 = 1/\sqrt{R_1 \cdot R_2 \cdot C_1 \cdot C_2} \tag{15}$$

The sharpness Q of resonance is given by the following equation:

$$Q = \sqrt{\frac{R_2 \cdot C_2}{R_1 \cdot C_1}} \tag{16}$$

As may be seen from these equations (15) and (16), it suffices to vary $R_1$ or $R_2$ for continuously varying the frequency. Since it is necessary to have a constant sharpness of resonance Q, both variable resistors are operatively linked to each other and varied to assure a constant ratio $R_1/R_2$.

Figure 11:
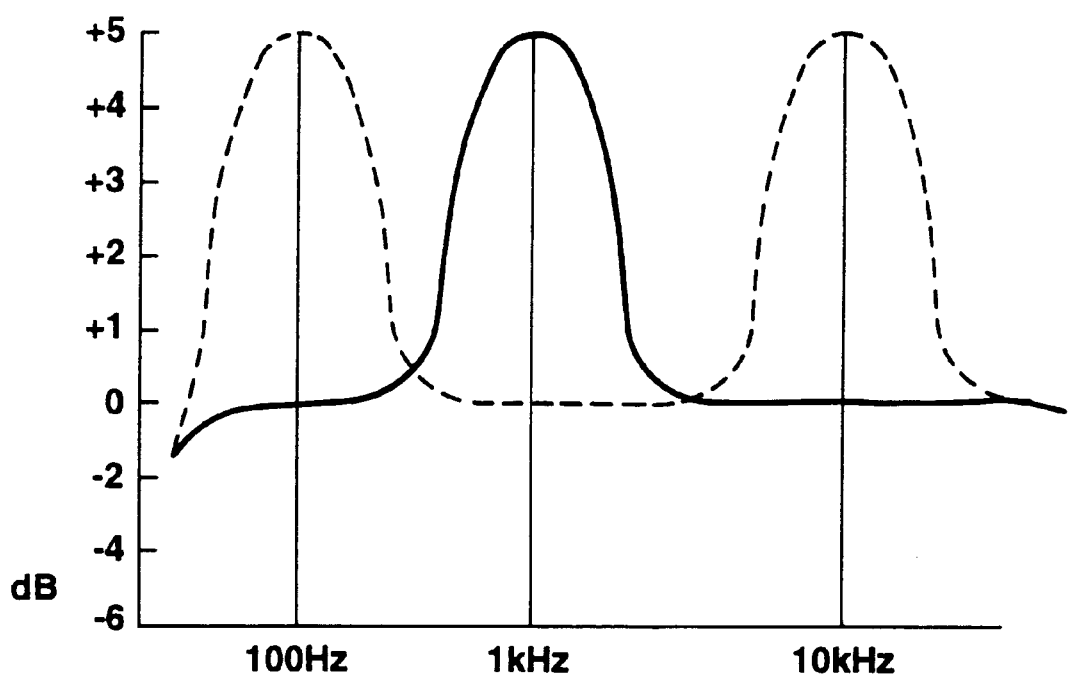
FIG. 11 is a graph showing frequency characteristics of the third embodiment of the sound quality adjustment circuit.

FIG. 11 is a graph showing the frequency response of a third embodiment of the sound quality adjustment circuit. It is shown therein that the frequency response can be continuously varied while the constant sharpness of resonance Q is kept.

Figure 12:
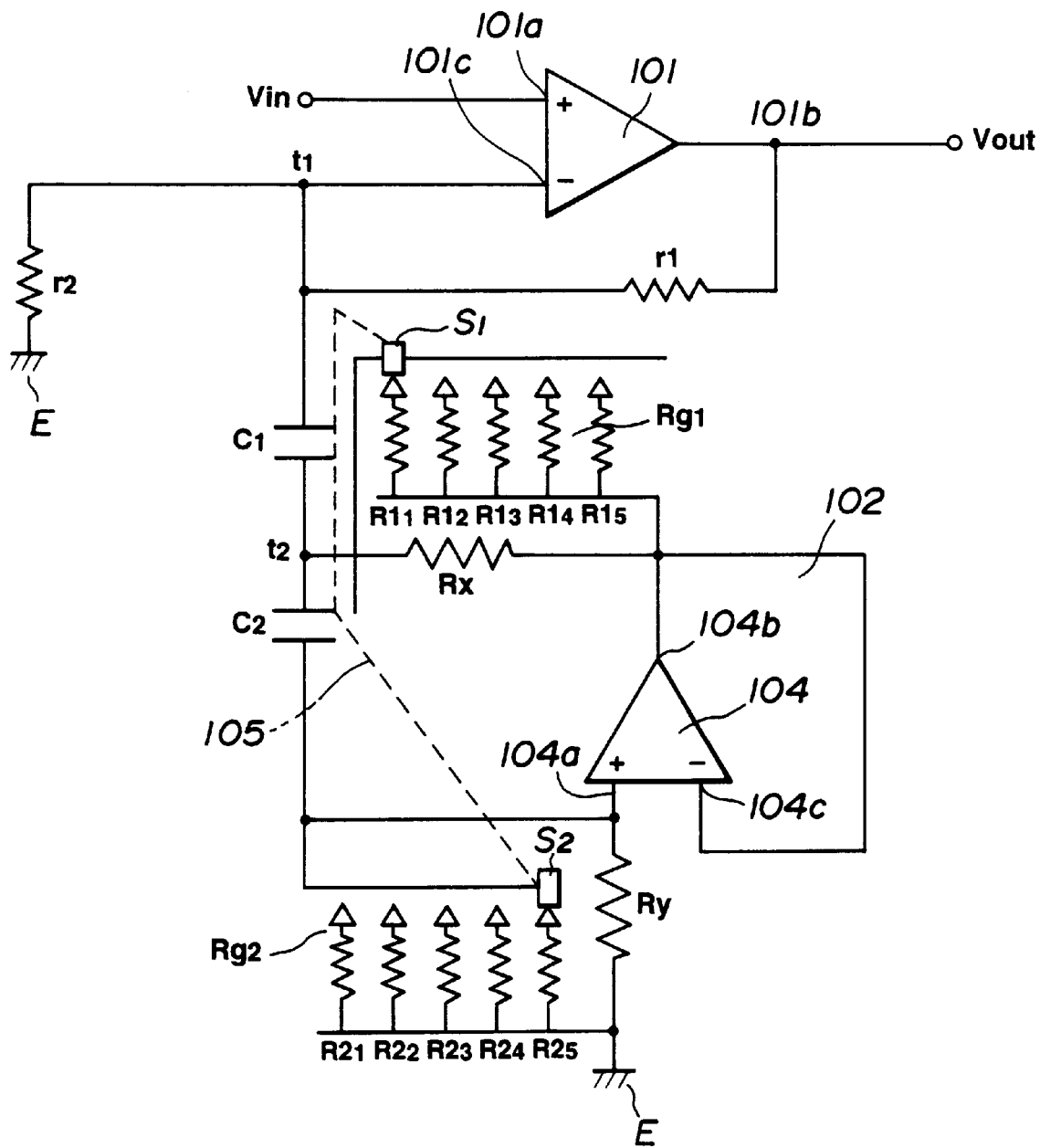
FIG. 12 is a circuit diagram showing a sound quality adjustment circuit according to a fourth embodiment of the present invention.

FIG. 12 is a circuit diagram of a fourth embodiment of the sound quality adjustment circuit of the present invention, in which a pre-set resistor is used in place of the variable resistors $R_1$ and $R_2$ of the third embodiment. In FIG. 13, parts or components similar in structure to the embodiment of FIG. 10a are depicted by the same reference numerals and the corresponding description is omitted for simplicity.

Between a terminal $t_2$ and the output terminal 104b of the second operational amplifier 104 is connected a first series of resistors Rg1 for connecting fixed resistors $R_{11}$ to $R_{15}$ in a one-out-of-five fashion in circuit by a first selector $S_1$. Similarly, between the non-inverting input terminal 104a of the second operational amplifier 104 and the ground E is connected a second series of resistors Rg2 for connecting fixed resistors $R_{21}$ to $R_{25}$ in a one-out-of-five fashion in circuit by a second selector $S_2$. The first selector $S_1$ and the second selector $S_2$ are interlocked with each other.

A parallel fixed resistor Rx is connected in parallel with the first series of resistors Rg1, while a parallel fixed resistor Ry is connected in parallel with the second series of resistors Rg2.

With movement of the selectors $S_1$ and $S_2$, the fixed resistors $R_{11}$ and $R_{25}$ are selected. With the next movement of the selectors $S_1$ and $S_2$, the fixed resistors $R_{12}$ and $R_{24}$ are selected. This varies the sum of the resistance values, with the resistance ratio remaining constant.

By this fourth embodiment of the sound quality adjustment circuit, desired sound quality adjustment point can be pre-set, thus facilitating adjustment.

The above-described sound quality adjustment circuit of the present invention is assumed to be used for sound quality adjustment of acoustic equipments, such as audio devices. However, the sound quality adjustment circuit can, of course, be applied to other types of the acoustic circuits.

In particular, since the sound quality adjustment circuit lends itself to be designed as an IC and hence can be reduced in size, so that it can be used as an acoustic device for the aged or those with hearing disabilities for fine correction of frequency characteristics.

What is claimed is:

1. A sound quality adjustment circuit comprising:

a status variable active band-pass filter fed with an input signal;

control means for controlling conversion conductance of the status variable active band-pass filter, wherein a center frequency of the status variable active band-pass filter is continuously varied by controlling the conversion conductance by said control means, and wherein said status variable active band-pass filter includes first amplification means including a first operational amplifier having a non-inverting input terminal fed with said input signal and an inverting input terminal; first voltage-to-current converting means for converting a first output voltage from said first operational amplifier into a first output current and first integrator means for integrating said first output current of said first voltage-to-current converting means; and second amplification means including a second operational amplifier having a non-inverting input terminal fed with an output of said first integrator means and an inverting input terminal; second voltage-to-current converting means for converting a second output voltage from a second output terminal of said second operational amplifier into a second output current; and second integrator means for integrating said second output current of said second voltage-to-current converting means, wherein an output of said second integrator means is fed back to said inverting input terminal of said first operational amplifier and to said inverting input terminal of said second operational amplifier; the first and second amplification means having conversion conductance values equal to each other; and a third operational amplifier having a non-inverting input terminal fed with said input signal and an inverting input terminal connected via a feedback resistor to a third output terminal of said third operational amplifier; and a third voltage-to-current converter connected across said inverting input terminal and ground, the third voltage-to-current converter having a conversion conductance thereof controlled by said control means.

* * * * *